United States Patent
Nguyen et al.

(10) Patent No.: US 9,479,179 B2
(45) Date of Patent: Oct. 25, 2016

(54) MEASURING SETUP AND HOLD TIMES USING A VIRTUAL DELAY

(71) Applicant: Globalfoundries Inc., Grand Cayman (KY)

(72) Inventors: Andy T. Nguyen, San Jose, CA (US); Navneet Jain, Milpitas, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 390 days.

(21) Appl. No.: 14/263,329

(22) Filed: Apr. 28, 2014

(65) Prior Publication Data

US 2015/0309113 A1  Oct. 29, 2015

(51) Int. Cl.
  G01R 31/02 (2006.01)
  H03K 23/50 (2006.01)
  H03K 5/22 (2006.01)
  G01R 31/317 (2006.01)

(52) U.S. Cl.
  CPC ......... H03K 23/50 (2013.01); G01R 31/31727 (2013.01); H03K 5/22 (2013.01)

(58) Field of Classification Search
  CPC .............. G01R 31/26; G01R 31/2642; G01R 31/2648; G01R 31/2831; G01R 31/31702; G01R 33/0047; G01R 1/0491; G01R 31/265; G01R 31/3012; G01R 31/318511; G01R 19/257; G01R 31/2884; G01R 31/3004; G01R 31/03; H01L 2933/0033; H01L 33/48

USPC ............ 324/762.01–762.03, 750.3; 714/731; 713/400, 401, 500, 501; 716/104–116
See application file for complete search history.

(56) References Cited

U.S. PATENT DOCUMENTS

| | | | | |
|---|---|---|---|---|
| 2010/0102890 A1* | 4/2010 | Stratz | ............... | G01R 31/31727 331/44 |
| 2012/0229146 A1* | 9/2012 | Ting | ................. | G01R 31/31932 324/617 |
| 2012/0280696 A1* | 11/2012 | Luo | ................... | G01R 31/31709 324/537 |
| 2013/0093488 A1* | 4/2013 | Ramaswami | .... | G01R 31/31725 327/276 |

* cited by examiner

Primary Examiner — Patrick Assouad
Assistant Examiner — Demetrius Pretlow
(74) Attorney, Agent, or Firm — Ditthavong & Steiner, P.C.

(57) ABSTRACT

Methodologies and an apparatus for measuring setup and hold times of fabricated semiconductor devices are provided. Embodiments include: providing a first digital frequency divider having an input and an output, the input of the first digital frequency divider receiving a first signal indicating an oscillating signal with a first delay; providing a second digital frequency divider having an input and output, the input of the second digital frequency divider receiving a second signal indicating the oscillating signal with a second delay; and providing a flip-flop having an input and an output, wherein the input of the flip-flop is coupled to the output of the second digital frequency divider and a data signal and clock signal for measuring a set-up time or hold time of a device under test are generated.

20 Claims, 12 Drawing Sheets

MEASURING SETUP AND HOLD TIMES USING A VIRTUAL DELAY

TECHNICAL FIELD

The present disclosure relates to methods and an apparatus for measuring setup and hold times of fabricated semiconductor devices (e.g., device under test). The present disclosure is particularly applicable to a built-in-self-test structure for measuring setup and hold times using a virtual delay (e.g., natural accumulation time).

BACKGROUND

Measuring setup and hold times of fabricated digital circuits may involve manual measurements, measurements using a tester device, or an on-chip tester using a finite state machine. Manual measurements may involve manually delaying a data signal with respect to a clock and recording an amount of delay when a device under test transitions from a pass status to a fail status. However, manual measurements may have a time consuming setup, have time consuming measurements, and utilize expensive hardware, such as a pulse generator with adjustable delay. A tester device may automatically delay a data signal with respect to a clock, thereby reducing measurement time. However, testers are extremely expensive and are still time consuming since data is physically delayed. An on-chip tester using a finite state machine may have a fast setup and a reduced measurement time. However, many on-chip testers use expensive hardware, such as, very sophisticated finite state machines, and digital and analog IP blocks. Moreover, such expensive hardware may occupy valuable space on a fabricated device.

A need therefore exists for methodology and an apparatus enabling reduced setup and measurement time without expensive hardware for measuring setup and hold times of fabricated semiconductor devices.

SUMMARY

An aspect of the present disclosure is a method including providing first and second digital frequency dividers and a flip-flop, wherein data and clock signals are based on a signal of an output of the first digital frequency divider and a signal of an output of the flip-flop, respectively.

Another aspect of the present disclosure is an apparatus method including first and second digital frequency dividers and a flip-flop, wherein data and clock signals are based on a signal of an output of the first digital frequency divider and a signal of an output of the flip-flop, respectively.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a first digital frequency divider having an input and an output, the input of the first digital frequency divider receiving a first signal indicating an oscillating signal with a first delay; providing a second digital frequency divider having an input and output, the input of the second digital frequency divider receiving a second signal indicating the oscillating signal with a second delay; providing a flip-flop having an input and an output, wherein the input of the flip-flop is coupled to the output of the second digital frequency divider and a data signal and clock signal for measuring a set-up time, hold time, or a combination thereof of a device under test are generated based on a signal of the output of the first digital frequency divider and a signal of the output of the flip-flop, respectively.

Aspects of the present disclosure include providing a first logical gate having first and second inputs and an output, wherein the first input of the first logical gate is coupled to the output of the first logical gate and to one or more first loading capacitors and wherein the first signal is generated based on a signal output on the output of the first logical gate; and providing a second logical gate having first and second inputs and an output, wherein the first input of the second logical gate is coupled to the output of the second logical gate and to one or more second loading capacitors, and wherein the second signal is generated based on a signal output on the output of the second logical gate. Some aspects include selectively switching to select one or more capacitors for the one or more first loading capacitors, one or more second loading capacitors, or a combination thereof based on a measurement resolution for measuring set-up time, hold time, or a combination thereof for the device under test. Further aspects include a method, wherein the first and second digital frequency dividers and the flip-flop are provided on a fabricated circuit device, the method further including receiving the first and second signals on one or more inputs to the fabricated circuit device. Additional aspects include providing one or more multiplexers configured to selectively couple the respective inputs of the first and second digital frequency dividers to configure the data signal and clock signal for measuring a set-up time for a first state, a set-up time for a second state, a hold time for the first state, or a hold time for the second state of the device under test. Some aspects include providing a logical gate circuit having a first input coupled to the output of the flip-flop, a second input, and an output, wherein the second input of the logical gate circuit receives a signal based on the second signal and wherein the clock signal is output on the output of the logical gate circuit. Further aspects include a method, wherein the device under test further includes an output, the logical gate circuit further includes a third input coupled to the output of the device under test, and the logical gate circuit is configured to compare a signal on the output of the device under test with a reference value and to generate a signal indicating a pass or fail state based on the comparison. Additional aspects include: determining a portion of the data signal and a portion of the clock signal based on an edge of the signal indicating a pass or fail state; and determining the set-up time, hold time, or a combination thereof for the device under test based on the portion of the data signal and the portion of the clock signal. Further aspects include a method, wherein the logical gate circuit is configured to generate a signal indicating a difference between the first and second delays, wherein the method further includes: determining the set-up time, hold time, or a combination thereof for the device under test based on the signal indicating a difference between the first and second delays.

Another aspect of the present disclosure is an apparatus including: a first digital frequency divider having an input and an output, the input of the first digital frequency divider receiving a first signal indicating an oscillating signal with a first delay; a second digital frequency divider having an input and output, the input of the second digital frequency divider receiving a second signal indicating the oscillating signal with a second delay; a flip-flop having an input and an output, wherein the input of the flip-flop is coupled to the output of the second digital frequency divider and a data signal and clock signal for measuring a set-up time, hold time, or a combination thereof of a device under test are generated based on a signal of the output of the first digital frequency divider and a signal of the output of the flip-flop, respectively.

Aspects include: a first logical gate having first and second inputs and an output, wherein the first input of the first logical gate is coupled to the output of the first logical gate and to one or more first loading capacitors and wherein the first signal is generated based on a signal output on the output of the first logical gate; and a second logical gate having first and second inputs and an output, wherein the first input of the second logical gate is coupled to the output of the second logical gate and to one or more second loading capacitors and wherein the second signal is generated based on a signal output on the output of the second logical gate. Some aspects include one or more multiplexers configured to selectively couple the respective inputs of the first and second digital frequency dividers to configure the data signal and clock signal for measuring a set-up time for a first state, a set-up time for a second state, a hold time for the first state, or a hold time for the second state of the device under test. Further aspects include a logical gate circuit having a first input coupled to the output of the flip-flop, a second input, and an output, wherein the second input of the logical gate circuit receives a signal based on the second signal and wherein the clock signal is further based on the output of the logical gate circuit. Additional aspects include an apparatus, wherein the device under test further includes an output, the logical gate circuit further includes a third input coupled to the output of the device under test, and the logical gate circuit is configured to compare a signal on the output of the device under test with a reference value and to generate a signal indicating a pass or fail state based on the comparison. Further aspects include an apparatus, wherein the first and second frequency dividers and the flip flop are a built-in-self-test circuit of the device under test.

Another aspect of the present disclosure is an apparatus including: a device under test having a data input, clock input, and output; and a test circuit having an input coupled to the output of the device under test and first and second outputs coupled the data and clock inputs, respectively, the test circuit including: a first digital frequency divider having an input and an output, the input of the first digital frequency divider receiving a first signal indicating an oscillating signal with a first delay; a second digital frequency divider having an input and output, the input of the second digital frequency divider receiving a second signal indicating the oscillating signal with a second delay; and a flip-flop having an input and an output, wherein the input of the flip-flop is coupled to the output of the second digital frequency divider and a data signal and clock signal for measuring a set-up time, hold time, or a combination thereof of a device under test are generated based on a signal of the output of the first digital frequency divider and a signal of the output of the flip-flop, respectively.

Aspects include an apparatus, wherein the test circuit further includes one or more multiplexers configured to selectively couple the respective inputs of the first and second digital frequency dividers to configure the data signal and clock signal for measuring a set-up time for a first state, a set-up time for a second state, a hold time for the first state, or a hold time for the second state of a device under test. Further aspects include an apparatus, wherein the test circuit further includes a logical gate circuit having a first input coupled to the output of the flip-flop, a second input, and an output coupled to the clock input, wherein the second input of the logical gate circuit receives a signal based on the second signal. Some aspects include an apparatus, wherein the test circuit further includes an oscillating signal circuit including: a first logical gate having first and second inputs and an output, wherein the first input of the first logical gate is coupled to the output of the first logical gate and to a first loading capacitor and wherein the oscillating signal with the first delay is generated based on a signal output on the output of the first logical gate; and a second logical gate having first and second inputs and an output, wherein the first input of the second logical gate is coupled to the output of the second logical gate and to a second loading capacitor and wherein the oscillating signal with the second delay is generated based on a signal output on the output of the second logical gate. Additional aspects include an apparatus, wherein the test circuit does not include a finite state machine.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, wellknown structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of time consumption and expensive hardware attendant upon measuring setup and hold times of (fabricated semiconductor) devices. In accordance with embodiments of the present disclosure, first and second digital frequency dividers and a flip-flop are provided, wherein data and clock signals are based on a signal of an output of the first digital frequency divider and a signal of an output of the flip-flop, respectively.

Methodology in accordance with embodiments of the present disclosure includes: providing a first digital frequency divider having an input and an output, the input of the first digital frequency divider receiving a first signal indicating an oscillating signal with a first delay; providing a second digital frequency divider having an input and output, the input of the second digital frequency divider receiving a second signal indicating the oscillating signal with a second delay; providing a flip-flop having an input and an output, wherein the input of the flip-flop is coupled to the output of the second digital frequency divider and a data signal and clock signal for measuring a set-up time, hold time, or a combination thereof of a device under test are generated based on a signal of the output of the first digital frequency divider and a signal of the output of the flip-flop, respectively.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
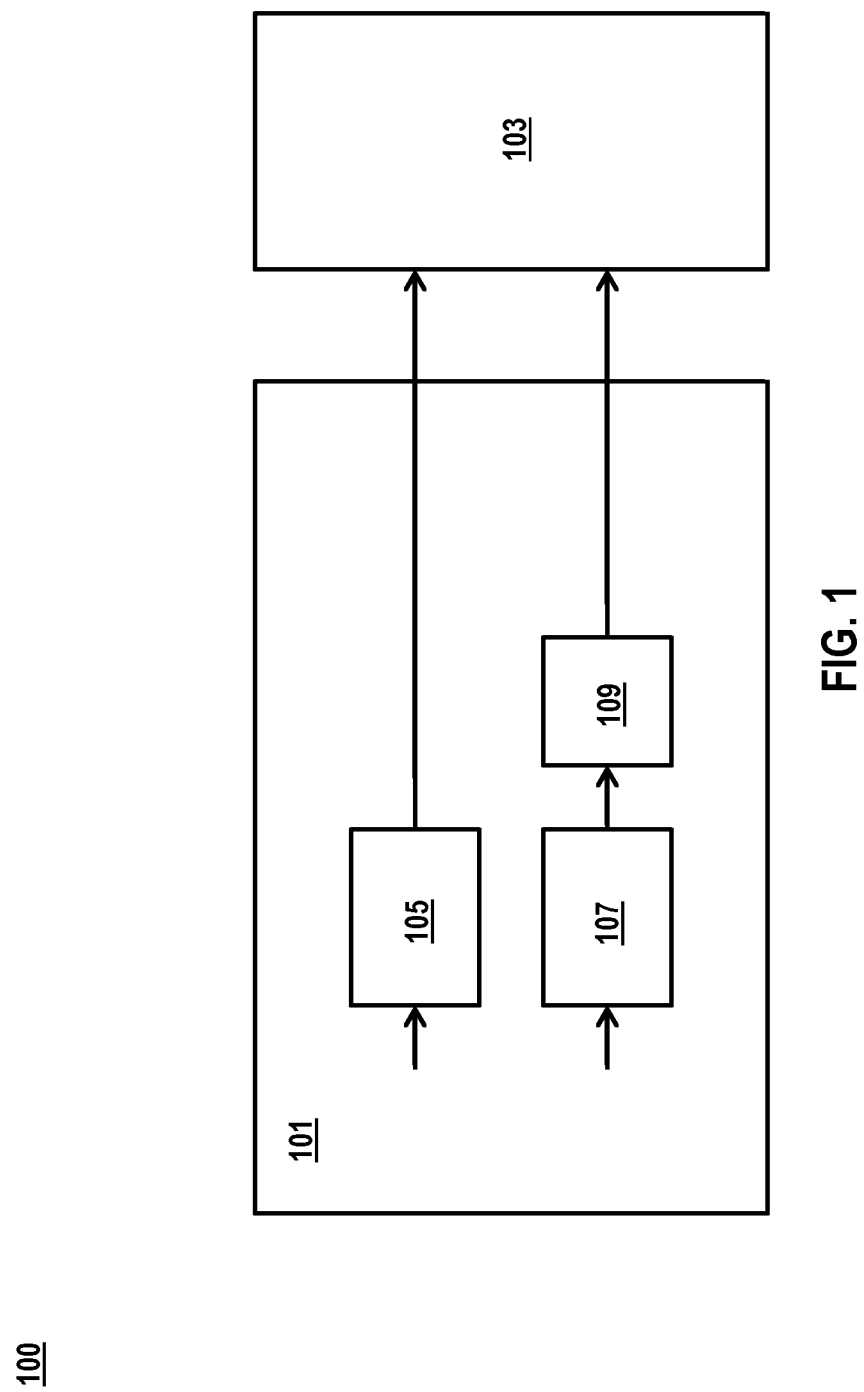
FIG. 1 illustrates a fabricated device, according to an exemplary embodiment.

FIG. 1 illustrates a device 100 having a built-in-test-structure 101 and a device under test 103. The structure 101 includes first and second digital frequency dividers 105 and 107 (e.g., divide by four digital frequency divider), respectively, and a flip-flop 109 (e.g., D-flip-flop). As shown, the first and second digital frequency dividers 105 and 107 receive a first signal indicating an oscillating signal with a first delay and a second signal indicating the oscillating signal with a second delay, respectively. By way of example, the first signal is the oscillating signal 201a of FIG. 2A or 201b of FIG. 2B and the second signal is the oscillating signal 203a of FIG. 2A or 203b of FIG. 2B.

Figure 2A:
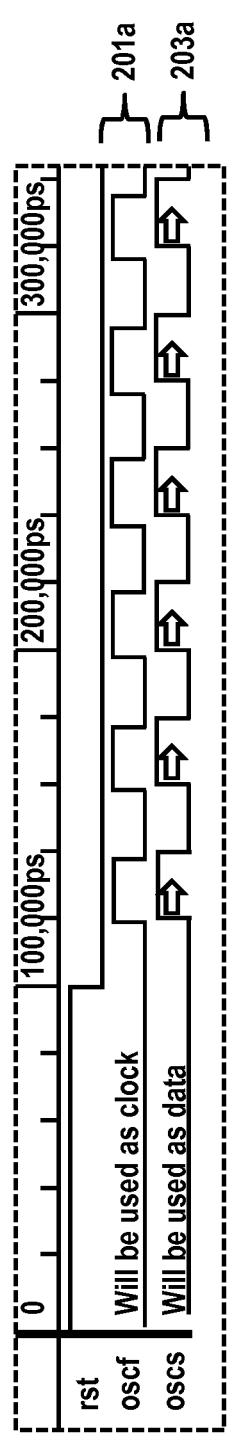
FIGS. 2A and 2B illustrate first and second signal indicating an oscillating signal having first and second delays, respectively, in accordance with an exemplary embodiment.

FIG. 2A illustrates a first signal 201a and a second signal 203a. As shown, the first signal 201a may be used as a clock signal and the second signal 203a may be used as a data signal for a time to set-up measurement. The first signal 201a and second signal 203a have first and second delays, respectively, resulting in an increase in a difference in delay with respect to time.

Figure 2B:
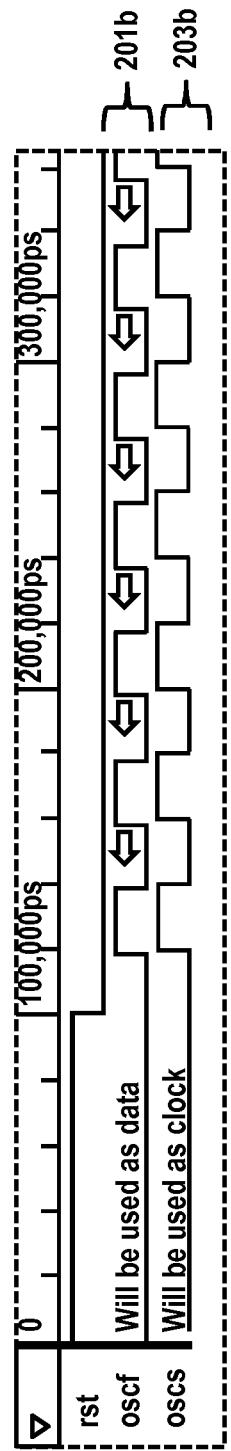

FIG. 2B illustrates a first signal 201b and second signal 203b. As shown, the first signal 201b may be used as a data signal and the second signal 203b may be used as a clock signal for a time to hold measurement. The first signal 201b and second signal 203b have first and second delays, respectively, resulting in an increase in a difference in delay with respect to time.

Figure 3:
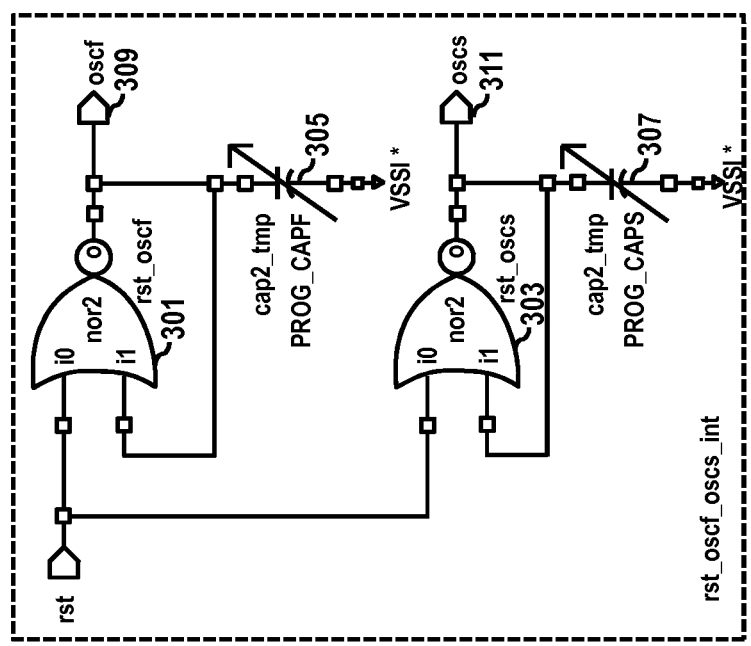
FIG. 3 illustrates a first oscillator circuit, according to an exemplary embodiment.

FIG. 3 illustrates a first oscillator circuit 300 having first and second logical gates 301 and 303, respectively, coupled to first and second loading capacitors 305 and 307, respectively to generate a first signal 309 (e.g., 201a, 203a, etc.) and a second signal 311 (e.g., 201b, 203b, etc.). As shown, the first and second logical gates 301 and 303 are NOR gates. The first and second loading capacitors 305 and 307 may be set, for instance, by selectively switching switches, to select capacitors, to a measurement resolution. For instance, first loading capacitor 305 is set to a low level and second loading capacitor 307 is set to the low level with an additional small capacitor for a fine measurement resolution or an additional large capacitor for a coarse measurement resolution.

Figure 4:
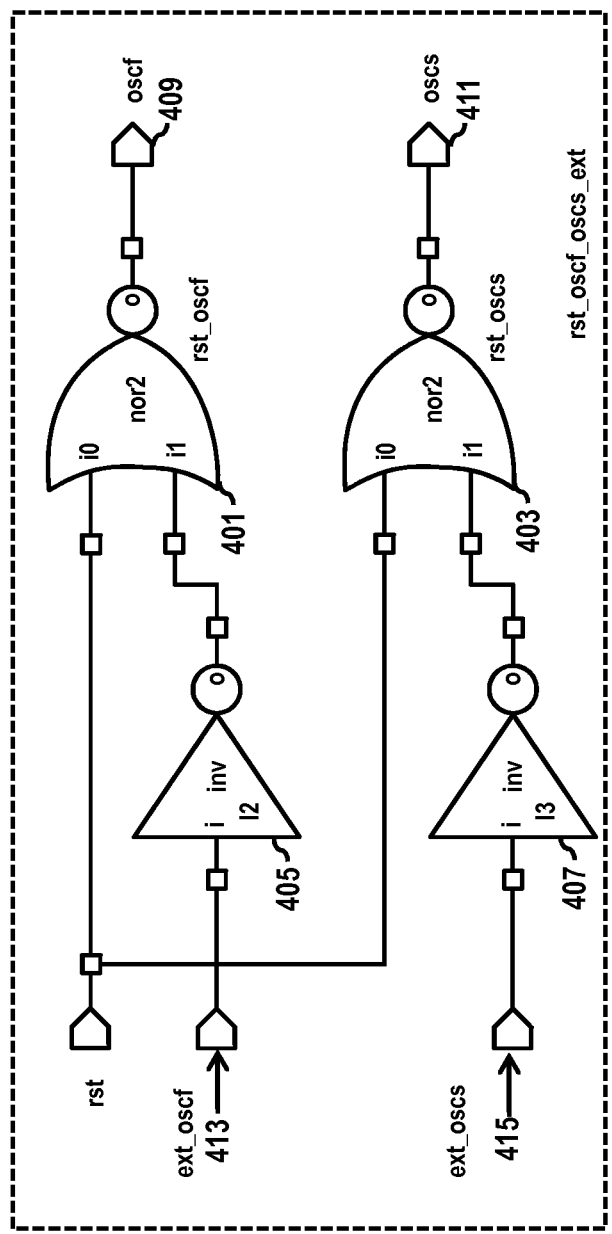
FIG. 4 illustrates a second oscillator circuit, according to an exemplary embodiment.

FIG. 4 illustrates a second oscillator circuit 400 having first and second logical NOR gates 401 and 403, respectively, coupled to first and second inverters 405 and 407, respectively, to generate a first signal 409 (e.g., 201a, 203a, etc.) and a second signal 411 (e.g., 201b, 203b, etc.). As shown, the first and second inverters 405 and 407 receive first and second external signals 413 and 415, respectively. The first and second external signals 413 and 415 may be generated, for instance, by an external pulse generator.

Figure 5:
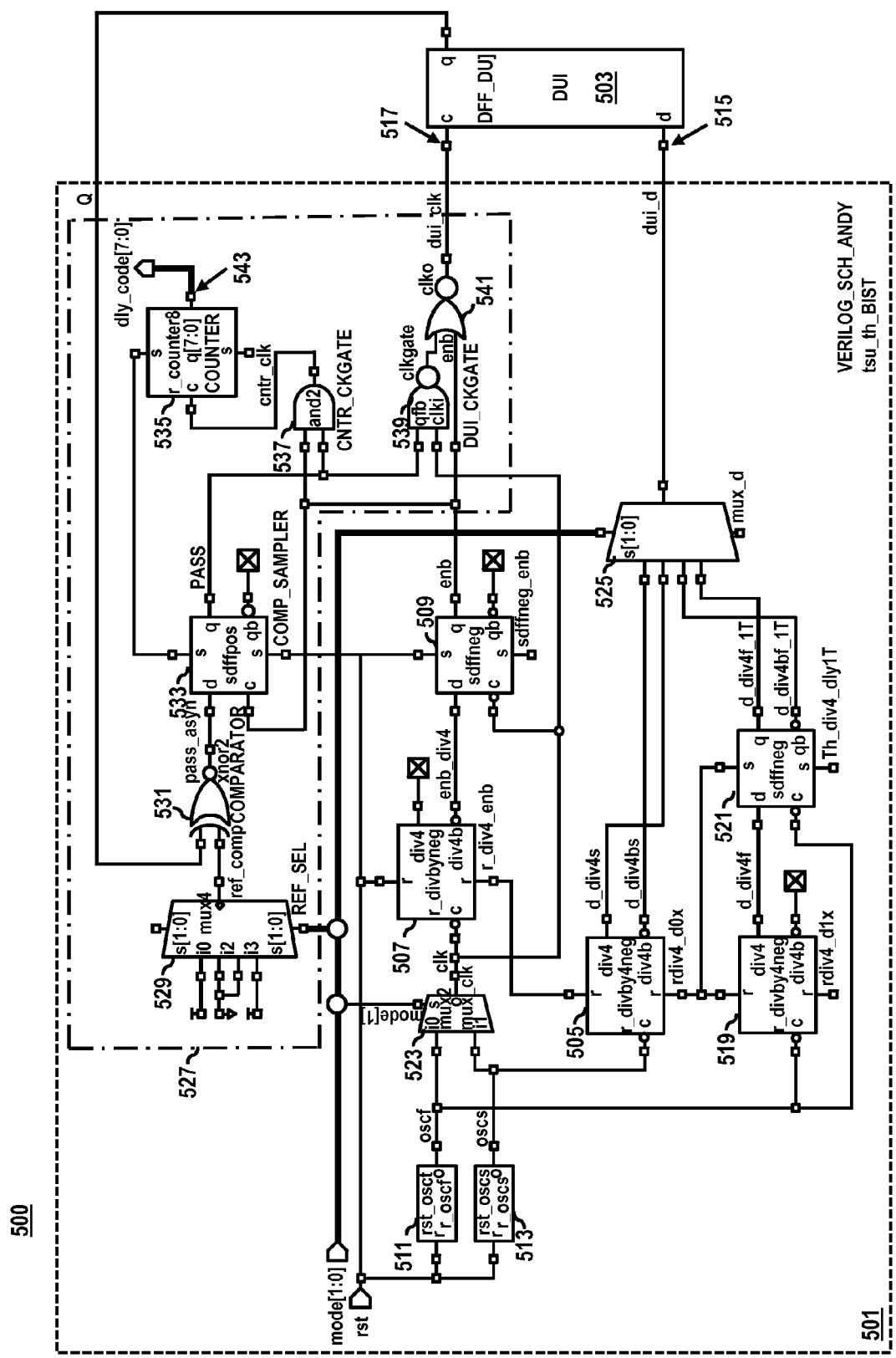
FIG. 5 illustrates a second fabricated device, according to an exemplary embodiment.

FIG. 5 illustrates a device 500 having a built-in-test-structure 501 and a device under test 503. Similar to structure 101 of FIG. 1, the structure 501 includes first and second digital frequency dividers 505 and 507 (e.g., divide by four digital frequency divider), respectively, a flip-flop 509 (e.g., D-flip-flop), and first signal 511 indicating an oscillating signal with a first delay and second signal 513 indicating the oscillating signal with a second delay. As shown, the device under test 503 includes a data input 515 and clock input 517. Moreover, structure 501 further includes a digital frequency divider 519 coupled to a flip-flop 521, multiplexers 523 and 525, and a logical gate circuit 527.

As shown, the multiplexer 523 selects between the first and second signals 511 and 513 to input into the frequency divider 507 and the multiplexer 525 selects between outputs of the frequency divider 505 and the flip-flop 521 to electronically couple to a data input 515 of the device under test 503. The multiplexers 523 and 525 are controlled to configure a clock signal for the clock input 517 and a data signal for the data input 515 to measure a set-up time for a first state (e.g., '1'), a set-up time for a second state (e.g., '0'), a hold time for the first state, or a hold time for the second state of the device under test 503.

As shown, the logical gate circuit 527 includes a multiplexer 529, comparator 531, D-flip-flop 533, counter 535, AND gate 537, NAND gate 539, and NOR gate 541. The multiplexer 529 is coupled to a plurality of reference values to selectively switch to an output coupled to the comparator 531, which compares the selected reference value to an output of the device under test 503. The D-flip-flop 533 receives an output of the comparator 531, and output of the flip-flop 509, and outputs a pass signal. The NOR gate 541 has an output electronically coupled to the clock input 517 of the device under test 503. As shown, the D-flip flop 533 outputs a signal indicating a pass state (e.g., '1') or a fails state (e.g., '0'). Accordingly, measurements of the device under test 503 may be measured directly by comparing a capture of signals on the data input 515 and clock input 517 as triggered by the output of the D-flip flop 533 moving from a pass state to a fail state. Alternatively, measurements of the device under test 503 may be measured indirectly based on an output 543 from the counter 535. Equation 1 may be used to indirectly calculate measurements of device 503, wherein DLY_CODE is an output of the counter 535, Period_OSCS is a period of the signal 511, and Period_OSCF is a period of the signal 513.

$$DLY\_CODE*4*(Period\_OSCS-Period\_OSCF) \quad \text{[EQUATION 1]}$$

Figure 6:
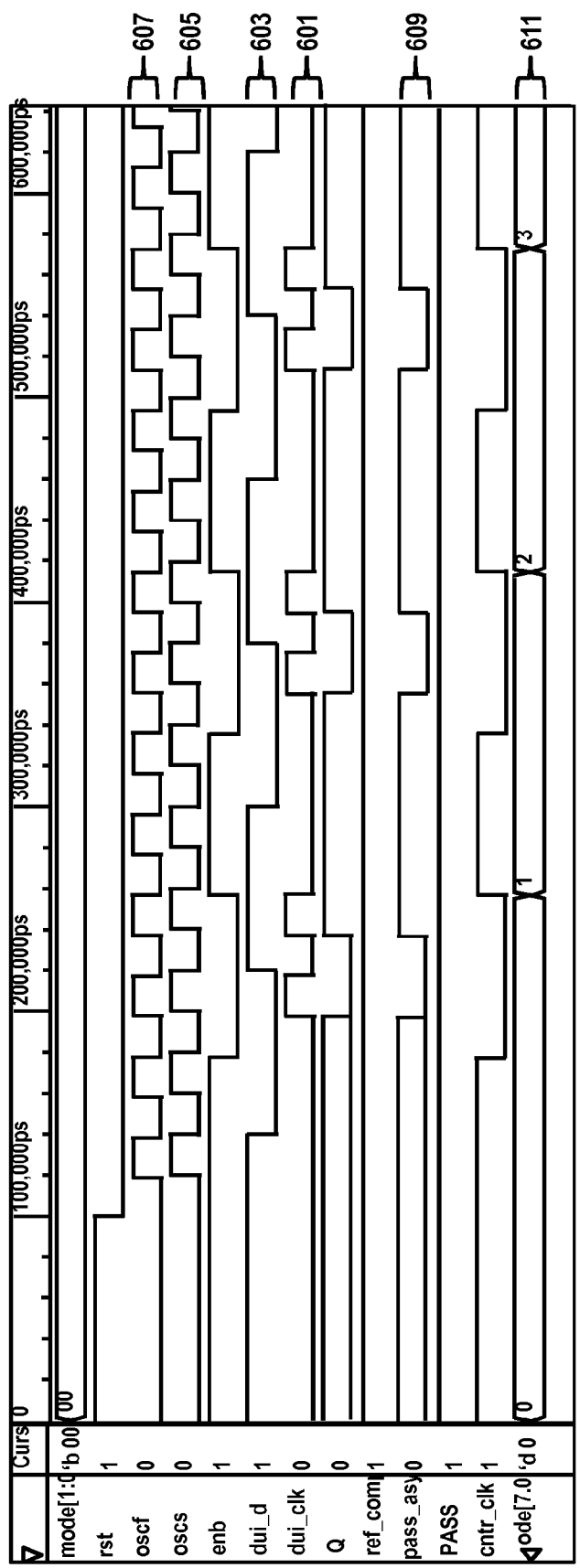
FIG. 6 illustrates various measurable parameters of a time to set-up an on-state, in accordance with an exemplary embodiment.

FIG. 6 illustrates exemplary results to measure a set-up time to turn-on, in accordance with an exemplary embodiment. FIG. 6 illustrates clock and data signals 601 and 603 that are provided to a device under test (e.g., 503) based on oscillating signals 605 and 607 to measure a set-up time to turn-on. Moreover, a pass signal 609 indicates a passing performance of the device under test, and the delay code signal 611 indicates a difference of delay between the clock and data signals 601 and 603. Accordingly, a difference of delay may be measured directly by comparing a capture of signals 601 and 603 as triggered by pass signal 609 moving from a pass state to a fail state. Alternatively, measurements of the device under test may be measured indirectly based on delay code signal 611 as triggered by pass signal 609 moving from a pass state to a fail state.

Figure 7A:
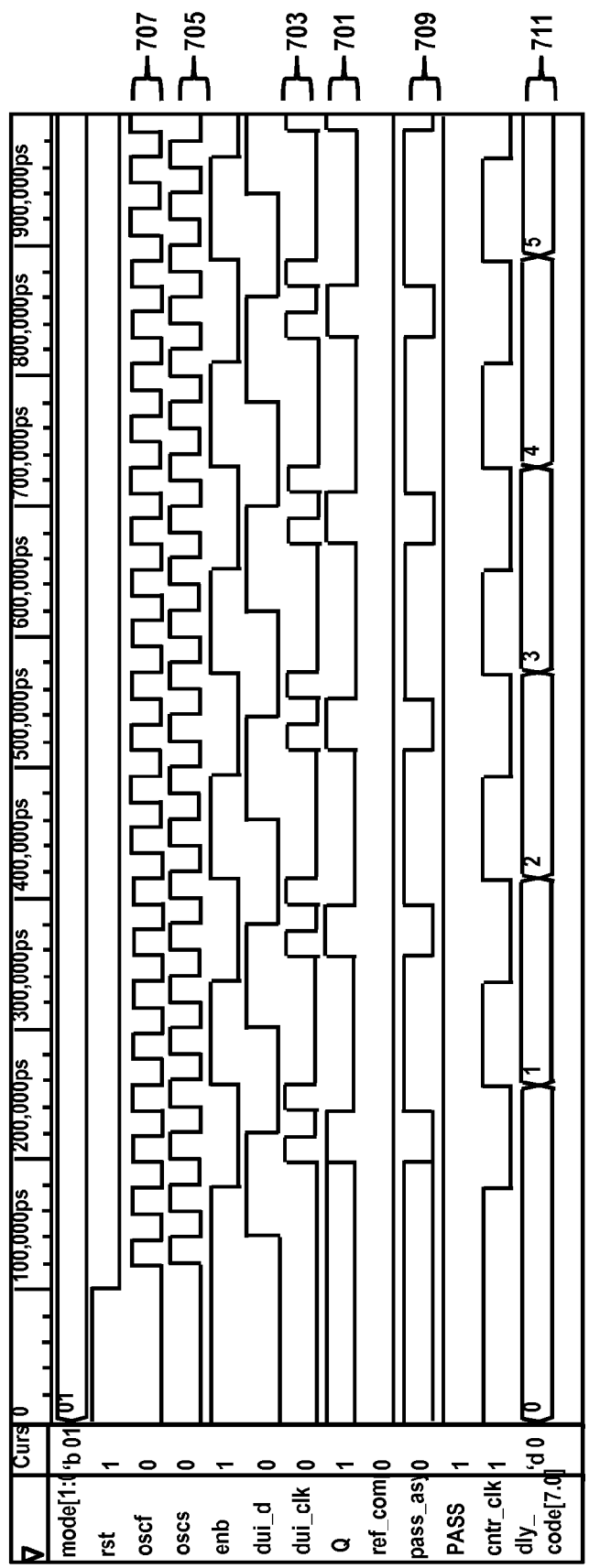
FIGS. 7A and 7B illustrate various measurable parameters of a time to set-up an off-state, in accordance with an exemplary embodiment.
Figure 7B:
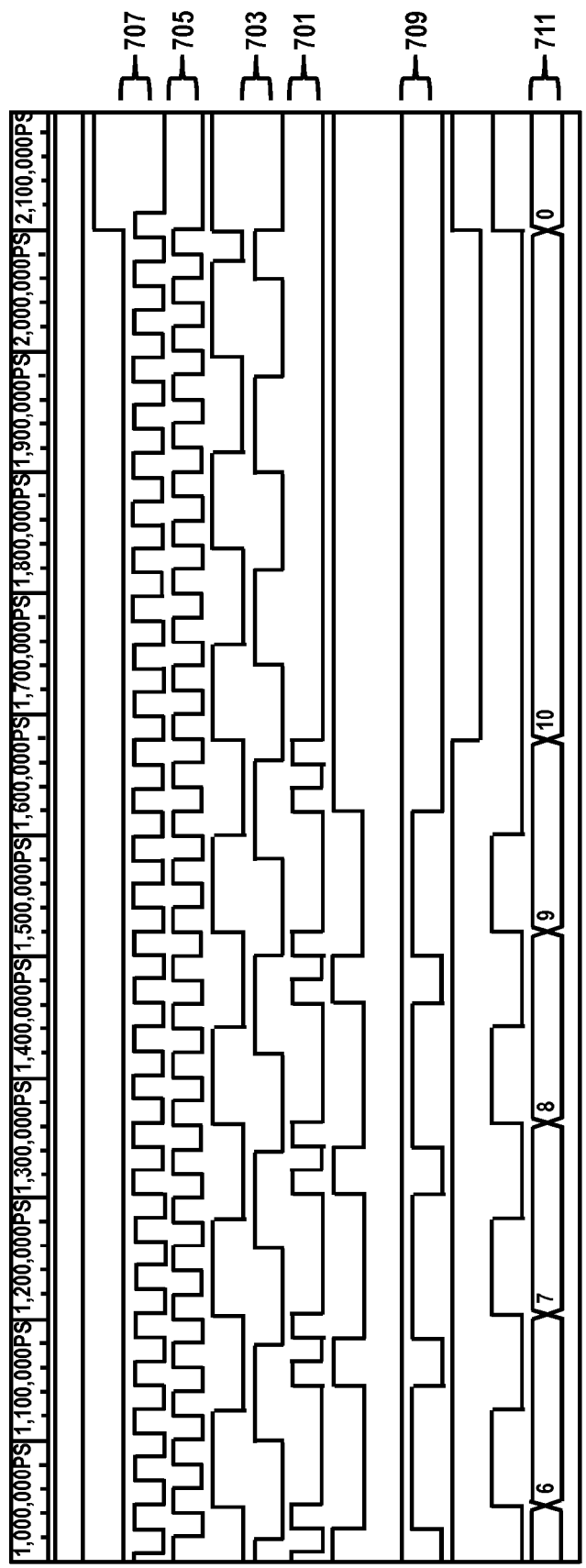

FIGS. 7A and 7B illustrate exemplary results to measure a set-up time for an off state, in accordance with an exemplary embodiment. Similar to FIG. 6, FIGS. 7A and 7B illustrate clock and data signals 701 and 703 that are provided to a device under test (e.g., 503) based on oscillating signals 705 and 707 to measure a set-up time for an off state. Moreover, a pass signal 709 indicates a passing performance of the device under test, and the delay code signal 711 indicates a difference of delay between the clock and data signals 701 and 703. Accordingly, a difference of delay may be measured directly by comparing a capture of signals 701 and 703 as triggered by pass signal 709 moving from a pass state to a fail state. Alternatively, measurements of the device under test may be measured indirectly based on delay code signal 711 as triggered by pass signal 709 moving from a pass state to a fail state.

Figure 8A:
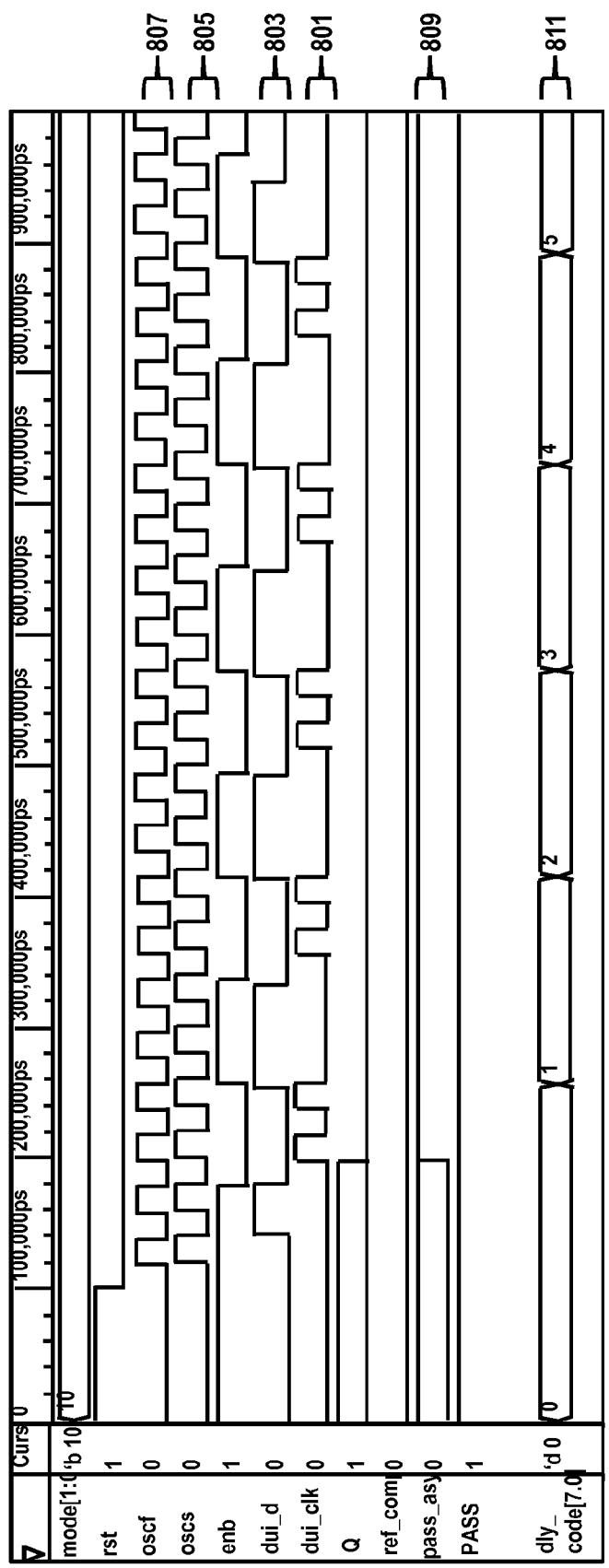
FIGS. 8A and 8B illustrate various measurable parameters of a time to hold an off-state, in accordance with an exemplary embodiment.
Figure 8B:
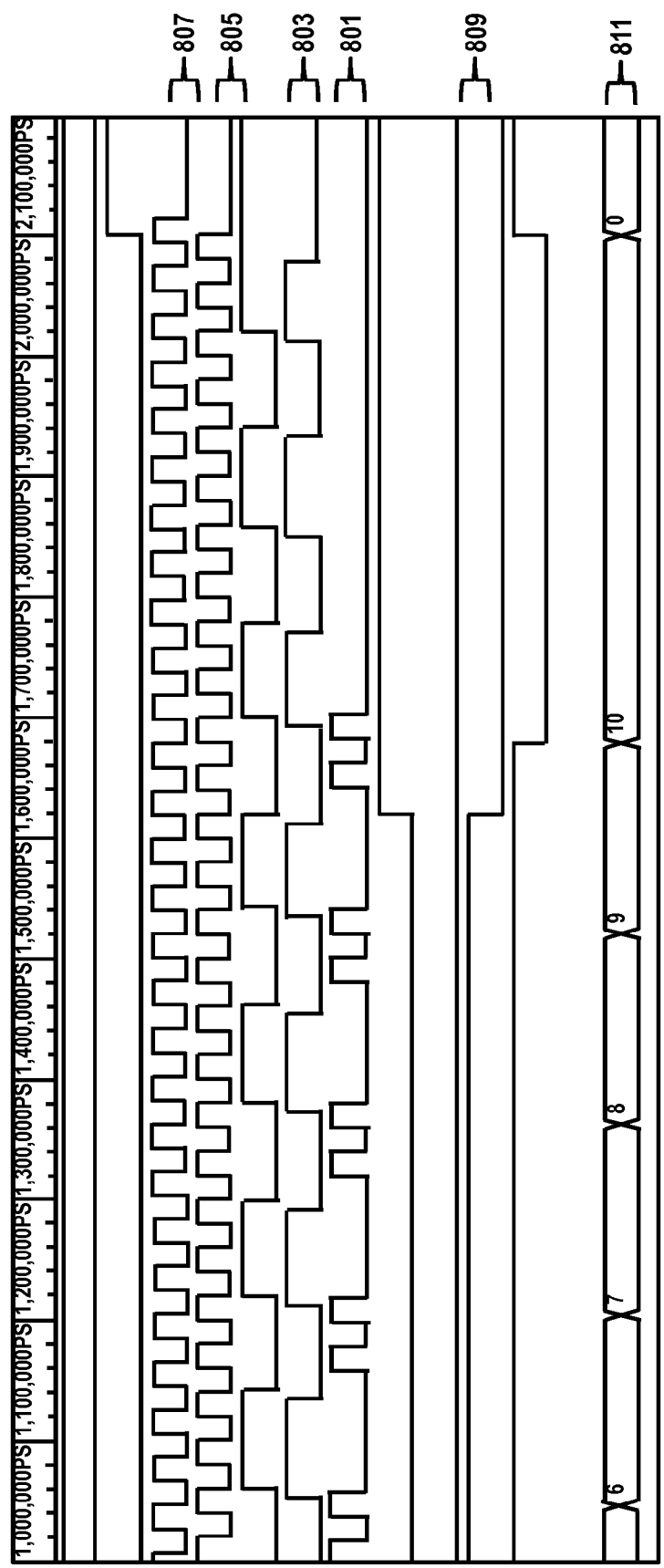

FIGS. 8A and 8B illustrate exemplary results to measure a hold time for an off state, in accordance with an exemplary embodiment. Similar to FIG. 6, FIGS. 8A and 8B illustrate clock and data signals 801 and 803 that are provided to a device under test (e.g., 503) based on oscillating signals 805 and 807 to measure a hold time for an off state. Moreover, a pass signal 809 indicates a passing performance of the device under test, and the delay code signal 811 indicates a difference of delay between the clock and data signals 801 and 803. Accordingly, a difference of delay may be measured directly by comparing a capture of signals 801 and 803 as triggered by pass signal 809 moving from a pass state to a fail state. Alternatively, measurements of the device under test may be measured indirectly based on delay code signal 811 as triggered by pass signal 809 moving from a pass state to a fail state.

Figure 9A:
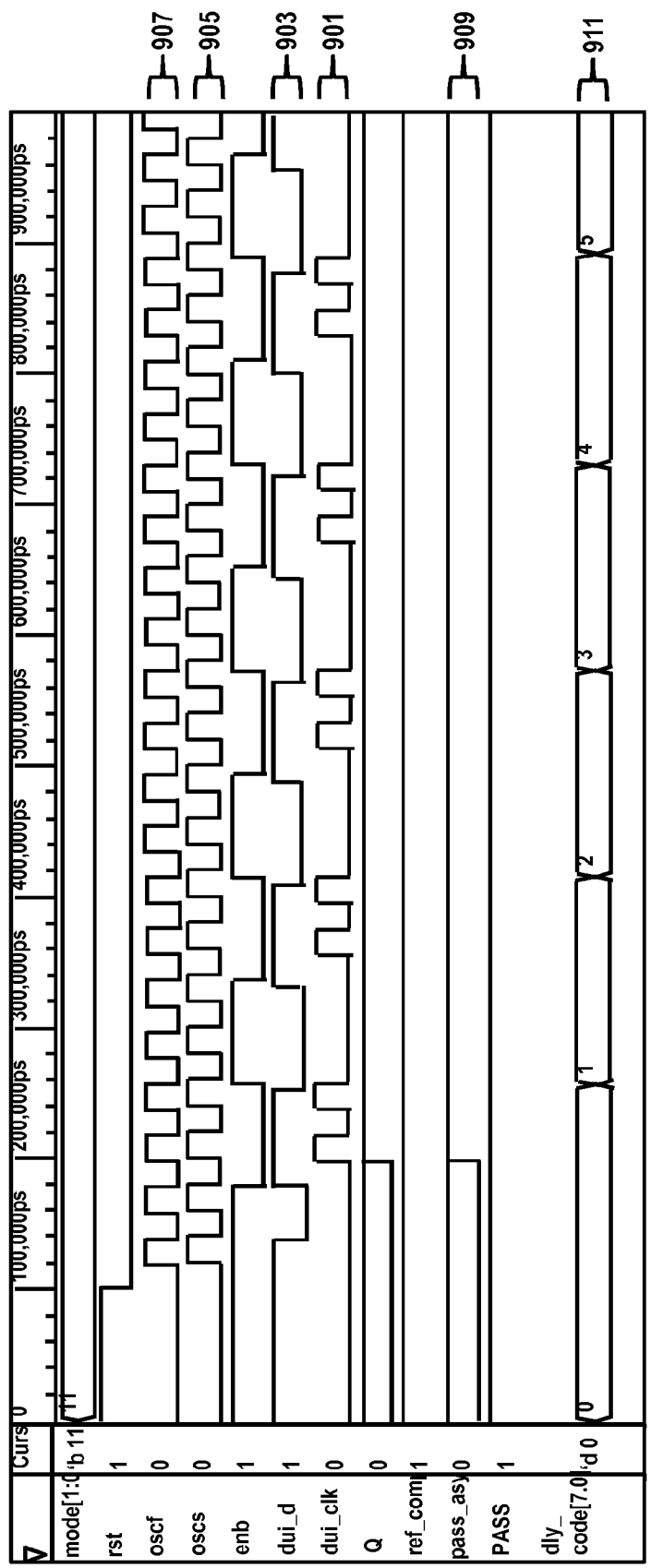
FIGS. 9A and 9B illustrate various measurable parameters of a time to hold an on-state, in accordance with an exemplary embodiment.
Figure 9B:
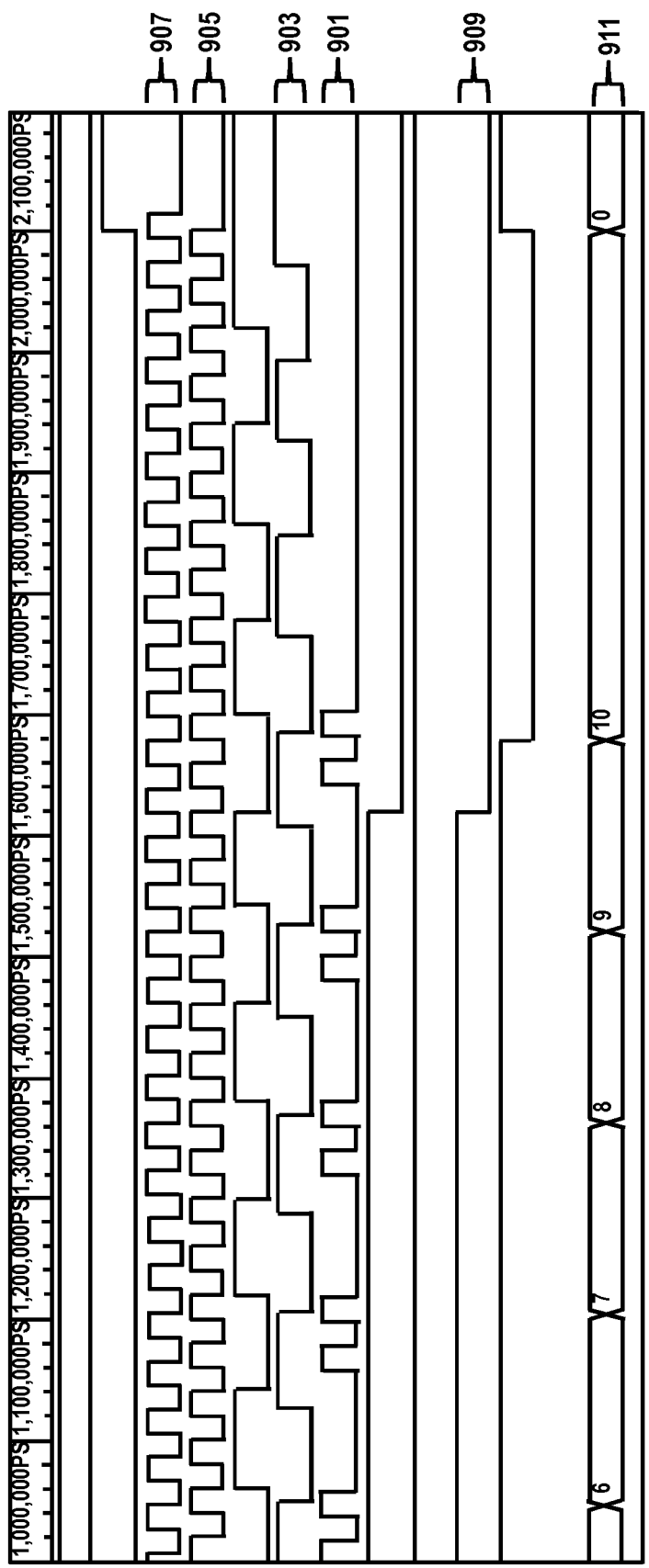

FIGS. 9A and 9B illustrate exemplary results to measure a hold time for an on state, in accordance with an exemplary embodiment. Similar to FIG. 6, FIGS. 9A and 9B illustrate clock and data signals 901 and 903 that are provided to a device under test (e.g., 503) based on oscillating signals 905 and 907 to measure a hold time for an on state. Moreover, a pass signal 909 indicates a passing performance of the device under test, and the delay code signal 911 indicates a difference of delay between the clock and data signals 901 and 903. Accordingly, a difference of delay may be measured directly by comparing a capture of signals 901 and 903 as triggered by pass signal 909 moving from a pass state to a fail state. Alternatively, measurements of the device under test may be measured indirectly based on delay code signal 911 as triggered by pass signal 909 moving from a pass state to a fail state.

The embodiments of the present disclosure can achieve several technical effects including a reduction of digital and analog components such as a course-delay chain, a thousand-to-1 glitch-free decoder, a thousand-to-one very balanced multiplexer, a fine-delay chain, a fine-delay multiplexer, a band-gap reference, a power supply regulator, and a gate-voltage regulator. Moreover, the present disclosure allows for a very simple sequence (e.g., using a divide by four frequency divider) to be generated directly from a clock signal for a data signal and enable signal, thereby allowing for a reduction of a sophisticated finite state machine to only a few discrete gates. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a first digital frequency divider having an input and an output, the input of the first digital frequency divider receiving a first signal indicating an oscillating signal with a first delay;
   providing a second digital frequency divider having an input and output, the input of the second digital frequency divider receiving a second signal indicating the oscillating signal with a second delay; and
   providing a flip-flop having an input and an output, wherein the input of the flip-flop is coupled to the output of the second digital frequency divider and a data signal and clock signal for measuring a set-up time, hold time, or a combination thereof of a device under test are generated based on a signal of the output of the first digital frequency divider and a signal of the output of the flip-flop, respectively.

2. The method according to claim 1, comprising:
   providing a first logical gate having first and second inputs and an output, wherein the first input of the first logical gate is coupled to the output of the first logical gate and to one or more first loading capacitors and wherein the first signal is generated based on a signal output on the output of the first logical gate; and
   providing a second logical gate having first and second inputs and an output, wherein the first input of the second logical gate is coupled to the output of the second logical gate and to one or more second loading capacitors, and wherein the second signal is generated based on a signal output on the output of the second logical gate.

3. The method according to claim 2, comprising:
selectively switching to select one or more capacitors for the one or more first loading capacitors, one or more second loading capacitors, or a combination thereof based on a measurement resolution for measuring set-up time, hold time, or a combination thereof for the device under test.

4. The method according to claim 1, wherein the first and second digital frequency dividers and the flip-flop are provided on a fabricated circuit device, the method further comprising receiving the first and second signals on one or more inputs to the fabricated circuit device.

5. The method according to claim 1, comprising:
providing one or more multiplexers configured to selectively couple the respective inputs of the first and second digital frequency dividers to configure the data signal and clock signal for measuring a set-up time for a first state, a set-up time for a second state, a hold time for the first state, or a hold time for the second state of the device under test.

6. The method according to claim 1, further comprising:
providing a logical gate circuit having a first input coupled to the output of the flip-flop, a second input, and an output, wherein the second input of the logical gate circuit receives a signal based on the second signal and wherein the clock signal is output on the output of the logical gate circuit.

7. The method according to claim 6, wherein the device under test further comprises an output, the logical gate circuit further comprises a third input coupled to the output of the device under test, and the logical gate circuit is configured to compare a signal on the output of the device under test with a reference value and to generate a signal indicating a pass or fail state based on the comparison.

8. The method according to claim 7, comprising:
determining a portion of the data signal and a portion of the clock signal based on an edge of the signal indicating a pass or fail state; and
determining the set-up time, hold time, or a combination thereof for the device under test based on the portion of the data signal and the portion of the clock signal.

9. The method according to claim 7, wherein the logical gate circuit is configured to generate a signal indicating a difference between the first and second delays, wherein the method further comprises:
determining the set-up time, hold time, or a combination thereof for the device under test based on the signal indicating a difference between the first and second delays.

10. An apparatus comprising:
a first digital frequency divider having an input and an output, the input of the first digital frequency divider receiving a first signal indicating an oscillating signal with a first delay;
a second digital frequency divider having an input and output, the input of the second digital frequency divider receiving a second signal indicating the oscillating signal with a second delay; and
a flip-flop having an input and an output, wherein the input of the flip-flop is coupled to the output of the second digital frequency divider and a data signal and clock signal for measuring a set-up time, hold time, or a combination thereof of a device under test are generated based on a signal of the output of the first digital frequency divider and a signal of the output of the flip-flop, respectively.

11. The apparatus according to claim 10, further comprising:
a first logical gate having first and second inputs and an output, wherein the first input of the first logical gate is coupled to the output of the first logical gate and to one or more first loading capacitors and wherein the first signal is generated based on a signal output on the output of the first logical gate; and
a second logical gate having first and second inputs and an output, wherein the first input of the second logical gate is coupled to the output of the second logical gate and to one or more second loading capacitors and wherein the second signal is generated based on a signal output on the output of the second logical gate.

12. The apparatus according to claim 10, further comprising:
one or more multiplexers configured to selectively couple the respective inputs of the first and second digital frequency dividers to configure the data signal and clock signal for measuring a set-up time for a first state, a set-up time for a second state, a hold time for the first state, or a hold time for the second state of the device under test.

13. The apparatus according to claim 10, further comprising:
a logical gate circuit having a first input coupled to the output of the flip-flop, a second input, and an output, wherein the second input of the logical gate circuit receives a signal based on the second signal and wherein the clock signal is further based on the output of the logical gate circuit.

14. The apparatus according to claim 13, wherein the device under test further comprises an output, the logical gate circuit further comprises a third input coupled to the output of the device under test, and the logical gate circuit is configured to compare a signal on the output of the device under test with a reference value and to generate a signal indicating a pass or fail state based on the comparison.

15. The apparatus according to claim 9, wherein the first and second frequency dividers and the flip flop are a built-in-self-test circuit of the device under test.

16. An apparatus comprising:
a device under test having a data input, clock input, and output; and
a test circuit having an input coupled to the output of the device under test and first and second outputs coupled the data and clock inputs, respectively, the test circuit comprising:
a first digital frequency divider having an input and an output, the input of the first digital frequency divider receiving a first signal indicating an oscillating signal with a first delay;
a second digital frequency divider having an input and output, the input of the second digital frequency divider receiving a second signal indicating the oscillating signal with a second delay; and
a flip-flop having an input and an output, wherein the input of the flip-flop is coupled to the output of the second digital frequency divider, wherein a data signal and clock signal for measuring a set-up time, hold time, or a combination thereof of the device under test are generated on the first and second outputs of the test circuit and the data and clock signals are based on a signal of the output of the first digital frequency divider and a signal of the output of the flip-flop, respectively.

17. The apparatus according to claim 16, wherein the test circuit further comprises one or more multiplexers configured to selectively couple the respective inputs of the first and second digital frequency dividers to configure the data signal and clock signal for measuring a set-up time for a first state, a set-up time for a second state, a hold time for the first state, or a hold time for the second state of a device under test.

18. The apparatus according to claim 17, wherein the test circuit further comprises a logical gate circuit having a first input coupled to the output of the flip-flop, a second input, and an output coupled to the clock input, wherein the second input of the logical gate circuit receives a signal based on the second signal.

19. The apparatus according to claim 16, wherein the test circuit further comprises an oscillating signal circuit comprising:
- a first logical gate having first and second inputs and an output, wherein the first input of the first logical gate is coupled to the output of the first logical gate and to a first loading capacitor and wherein the oscillating signal with the first delay is generated based on a signal output on the output of the first logical gate; and
- a second logical gate having first and second inputs and an output, wherein the first input of the second logical gate is coupled to the output of the second logical gate and to a second loading capacitor and wherein the oscillating signal with the second delay is generated based on a signal output on the output of the second logical gate.

20. The apparatus according to claim 18, wherein the test circuit does not include a finite state machine.

* * * * *